United States Patent
Kim et al.

(10) Patent No.: US 10,828,878 B2
(45) Date of Patent: Nov. 10, 2020

(54) SYSTEMS AND METHODS FOR ELECTROMECHANICAL TRANSFER PRINTING OF TWO DIMENSIONAL MATERIALS

(71) Applicant: Massachusetts Institute of Technology, Cambridge, MA (US)

(72) Inventors: Sanha Kim, Cambridge, MA (US); Anastasios John Hart, Waban, MA (US); Piran Ravichandran Kidambi, Nashville, TN (US); Dhanushkodi Durai Mariappan, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 232 days.

(21) Appl. No.: 15/908,282

(22) Filed: Feb. 28, 2018

(65) Prior Publication Data

US 2018/0244027 A1 Aug. 30, 2018

Related U.S. Application Data

(60) Provisional application No. 62/464,649, filed on Feb. 28, 2017.

(51) Int. Cl.
*B32B 37/00* (2006.01)
*B32B 38/00* (2006.01)
(Continued)

(52) U.S. Cl.
CPC .......... *B32B 37/025* (2013.01); *B32B 9/005* (2013.01); *B32B 27/06* (2013.01);
(Continued)

(58) Field of Classification Search
CPC ..... B32B 41/00; B32B 38/0008; B32B 27/06; B32B 9/005; B32B 37/025
See application file for complete search history.

(56) References Cited

U.S. PATENT DOCUMENTS

| | | | |
|---|---|---|---|
| 7,790,242 B1* | 9/2010 | Sumanasekera | .... C23C 14/0605 427/457 |
| 2009/0200707 A1 | 8/2009 | Kivioja et al. | |

(Continued)

OTHER PUBLICATIONS

Bae, S., Kim, H., Lee, Y., Xu, X., Park, J.-S., Park, J.-S., Zheng, Y., Balakreishnan, J., Lei, T., Kim, H.R., Song, Y.I., Kim, Y.-J., Kim, K.S., Ozyilmax, B., Ahn, J.-H., Hong, B.H. And Lijima, S., "Roll-to-roll production of 30-inch graphene films for transparent electrodes. Nature Nanotechnology," 2010. 5(8): p. 574-578.

(Continued)

*Primary Examiner* — Daniel McNally
(74) *Attorney, Agent, or Firm* — Nutter McClennen & Fish LLP

(57) ABSTRACT

Systems, devices, and related methods are disclosed for electromechanical transfer printing of 2D materials disposed on one substrate to another. The printing device can be configured to transfer a 2D material from a source substrate to the target substrate by applying a combination of mechanical and electrostatic forces to facilitate electromechanical adhesion between the 2D material layer and the target substrate. Some embodiments of the printing device can effect direct transfer printing of a 2D material from a source substrate to a target substrate without the use of etchants and adhesives.

11 Claims, 8 Drawing Sheets

(51) Int. Cl.
| | |
|---|---|
| B32B 41/00 | (2006.01) |
| B32B 9/00 | (2006.01) |
| B32B 27/06 | (2006.01) |
| H05K 3/02 | (2006.01) |
| H05K 1/09 | (2006.01) |
| B82Y 10/00 | (2011.01) |
| H01L 29/16 | (2006.01) |

(52) U.S. Cl.
CPC .......... *B32B 38/0008* (2013.01); *B32B 41/00* (2013.01); *H05K 3/025* (2013.01); *B32B 2038/0052* (2013.01); *B32B 2307/204* (2013.01); *B82Y 10/00* (2013.01); *H01L 29/1606* (2013.01); *H05K 1/097* (2013.01); *H05K 2203/0152* (2013.01)

(56) References Cited

U.S. PATENT DOCUMENTS

| | | | | |
|---|---|---|---|---|
| 2010/0101710 | A1* | 4/2010 | Choi | B82Y 30/00 156/230 |
| 2010/0140219 | A1* | 6/2010 | Liang | C01B 32/182 216/41 |
| 2011/0100951 | A1* | 5/2011 | Juang | B32B 37/025 216/13 |
| 2013/0041125 | A1 | 2/2013 | Hishida et al. | |
| 2013/0233480 | A1* | 9/2013 | Na | B32B 37/025 156/249 |
| 2015/0151528 | A1 | 6/2015 | Shimizu et al. | |
| 2015/0240038 | A1 | 8/2015 | Macedo Fechine et al. | |
| 2016/0176162 | A1 | 6/2016 | Johnson et al. | |
| 2016/0282768 | A1 | 9/2016 | Bayer et al. | |
| 2016/0365165 | A1 | 12/2016 | Jo et al. | |

OTHER PUBLICATIONS

Banszerus, L. et al., "Ultrahigh-mobility graphene devices from chemical vapor deposition on reusable copper," Scientific Advances. Jul. 31, 2015;1:e1500222.

Bernardi, M., M. Palummo, and J.C. Grossman, "Extraordinary Sunlight Absorption and One Nanometer Thick Photovoltaics Using Two-Dimensional Monolayer Materials." Nano Letters, 2013. 13(8): p. 3664-3670.

Butler, S.Z., Hollen, S.M., Cao, L., Cui, Y., Gupta, J.A., Gutierrez, H.R., Heinz, T.F., Hong, S.S., Huang, J., Ismach, A. F., Johnston-Halperin, E., Kuno, M., Plashnitsa, V.V., Robinson, R.D., Ruoff, R.S., Salahuddin, S., Shan, J. Shi, L., Spencer, M.G., Terrones, M., Windl, W. and Goldberger, J.E., "Progress, Challenges, and Opportunities in Two-Dimensional Materials Beyond Graphene." Acs Nano, 2013. 7(4): p. 2898-2926.

Cohen-Tanugi, D. and J.C. Grossman, Water Desalination across Nanoporous Graphene. Nano Letters, 2012. 12(7): p. 3602-3608.

David, L., Bhandavat, R., & Singh, G. (2014). "MoS2/graphene composite paper for sodium-ion battery electrodes," ACS Nano, 8(2); pp. 1759-1770 Retrieved from http://krex.ksu.edu.

Geim, A.K. and I.V. Grigorieva, "Van der Waals heterostructures." Nature, 2013. 499(7459): p. 419-425.

International Search Report and Written Opinion for Application No. PCT/US20181020276, dated May 11, 2018 (17 pages).

Kang, J. Shin, D., Bae, S. and Hong, B.H., "Graphene transfer: key for applications." Nanoscale, 2012. 4(18): p. 5527-5537.

Kim, S., et al., "Continuous-Feed Electromechanical Transfer Printing of Graphene," (Abstract), Materials Research Society, 2017 Meeting & Exhibit, Boston, MA; presented Nov. 29, 2017.

Kumar, A. and Lee, Chee Huei, "Synthesis and Biomedical Applications of Graphene: Present and Future Trends," In Advances in Graphene Science, ed. By M. Aliofkhazraei, © 2013, Publ. Jul. 31, 2013; <http://dx.doi.org/10.5772/55728>.

Novoselov, K.S., Fal'ko, V.I., Colombo, L., Gellert, P.R., Schwab, M.G. and Kim, K., A roadmap for graphene. Nature, 2012. 490(7419): p. 192-200.

Novoselov, K. S., Geim, A.K., Morozov, S.V., Jiang, D., Zhang, Y., Dubonos, S.V., Grigorieva, I.V., and Firsov, A.A., Electric field effect in atomically thin carbon films. Science, 2004. 306(5696): p. 666-669.

Novoselov, K. S., et al., "Two-dimensional crystals-based heterostructures: materials with tailored properties," Phys. Scr. T146 (Jan. 2012) 014006 (6pp).

Pirkle, A., Chan, J., Venugopal, A., Hinojos, D., Magnuson, C.W., McDonnell, S., Colombo, L., Vogel, E.M., Ruoff, R.S. and Wallace, R.M., "The effect of chemical residues on the physical and electrical properties of chemical vapor deposited graphene transferred to SiO2." Applied Physics Letters, 2011. 99(12).

Regan, E., Alem, N., Aleman, B., Geng, B., Girit, C. Maserati, L., Wang, F., Crommie, M., Zettl, A., "A direct transfer of layer-area graphene." Applied Physics Letters, 2010. 96(11) 113102.

Roy, T., et al, "Field-Effect Transistors Built from All Two-Dimensional Material Components," ACS Nano [May 7, 2014, 8(6):6259-6264].

Wang, R. et al., "Catalyst interface engineering for improved 2D film lift-off and transfer," 2016, ACS Appl. Mater. Interfaces 2016,8, 33072-33082.

Yankowitz, M., Xue, J., Cormode, D., Sanchez-Ymagishi, J.D., Watanabe, K., Taniguchi, T., Jarillo-Herrero, P., Jacquod, P. and LeRoy, B.J., "Emergence of superlattice Dirac points in graphene on hexagonal boron nitride." Nature Physics, 2012. 8(5): p. 382-386.

* cited by examiner

SYSTEMS AND METHODS FOR ELECTROMECHANICAL TRANSFER PRINTING OF TWO DIMENSIONAL MATERIALS

RELATED APPLICATION(S)

This application claims the benefit of U.S. Provisional Patent Application No. 62/464,649, filed on Feb. 28, 2017, the entire contents of which are incorporated herein by reference.

FIELD

The present disclosure relates to systems for printing of two dimensional (2D) materials on a substrate and related methods, and specifically to systems for electromechanical transfer printing of 2D materials disposed on one substrate to another.

BACKGROUND

Two dimensional (2D) materials can be categorized generally as 2D allotropes of an atomic element or compound with in-plane covalent bonds. 2D materials can include crystalline materials formed of a single atomic layer. Exemplary 2D materials can include, but are not limited to, graphene, flourographene, boron nitride, and transition metal dichalcogenides, such as disulfides (e.g., molybdenum disulfide) and diselenides (e.g., tungsten diselenide). Layered combinations of different 2D materials are generally referred to as Van der Waals heterostructures.

2D materials are being used, or investigated for use, in a variety of applications including, but not limited to, photovoltaics, semiconductors, electronics, batteries, composites, filtration membranes and wearable devices. For example, 2D materials can provide a broad range of building blocks for next-generation ultrathin electronics in large area, flexible, and stretchable formats.

2D materials can be produced on metallic substrates using conventional chemical vapor deposition (CVD) processes. For example, graphene can be produced on surfaces of copper foil by decomposing carbon precursor including, but not limited to, methane, ethylene, ethanol, at high temperature. However, many applications demand use of a substrate that is thermally and/or chemically incompatible with CVD processes, such as semiconductive substrates (e.g. silicon, gallium nitride) and dielectric substrates (e.g. silicon oxides, polyethylene terephthalate). For such applications, it can be desirable to transfer the 2D material from the source substrate onto another substrate.

Existing techniques for transferring 2D materials from one substrate to another can involve wet chemistry techniques (e.g., chemical etching) that etch or dissolve source substrate away from the 2D material layer. In other existing techniques, an adhesive tape or epoxy can be used to transfer the 2D material layer away from the source substrate to the target substrate. However, such transfer methods can exhibit a number of disadvantages. For example, such methods can include many time-consuming steps, rendering such methods unacceptably slow (e.g., from several minutes to hours). Such methods can leave residue (e.g., non-etched substrate material, adhesive substance, etc.) or cause unintended doping of the 2D material, thereby causing defects in the structure or performance of the fabricated device. Such methods can also be wasteful in that transfers by chemical etching or adhesives may prevent the source substrate from being recycled or renewed.

Therefore, the lack of a viable transfer printing process for 2D materials can be a roadblock to the pace of research, and moreover to the realization of novel applications of 2D materials. Accordingly, there is a need for systems and related methods that facilitate scalable and effective transfer printing of 2D materials from one substrate to another.

SUMMARY

The present disclosure is directed to various systems, devices, and methods configured to perform electromechanical transfer printing of 2D materials (e.g., graphene) from a source substrate (e.g., a copper foil) to a target substrate (e.g., polyethylene terephthalate, PET). Various embodiments of the printing device can be configured to transfer a layer or pattern of 2D material from a source substrate to the target substrate by applying a combination of mechanical and electrostatic forces to facilitate electromechanical adhesion between the 2D material layer and the target substrate. Embodiments of the printing device can produce electromechanical adhesion, such that the work of adhesion between the 2D material and the target substrate exceeds the work of adhesion between the 2D material and the source substrate. Accordingly, some embodiments of the printing device can effect direct transfer printing of a 2D material from a source substrate to a target substrate without the use of etchants and adhesives (e.g., tape, epoxies, etc.). In some embodiments, the mechanical adhesion produced by contact between the 2D material layer and the target substrate can be improved by heating the target substrate to a rubbery or viscous state, which facilitates increased surface contact between the 2D material layer and the target substrate. In some embodiments, a pre-oxidization process can be performed on the source substrate with the 2D material previously disposed thereon to reduce the work of adhesion therebetween and thus facilitate a reduction in the mechanical and electrostatic force requirements to effect transfer of the 2D material layer to the target substrate.

In one exemplary embodiment of an electromechanical transfer printing system, the printing device can include a first force applicator configured to receive a first substrate having a two-dimensional (2D) material disposed thereon and a second force applicator configured to receive a second substrate. The second force applicator can be opposed to the first force applicator such that a first substrate having a 2D material disposed thereon received by the first force applicator and a second substrate received by the second force applicator can be disposed between the first and second force applicators. A force controller can be configured to control one or both of the first force applicator and the second force applicator to apply a mechanical force or a mechanical pressure that presses at least one of the first substrate and the second substrate towards the other to place the 2D material disposed on the first substrate in contact with a surface of the second substrate. A power supply can be coupled to a first conductive element and a second conductive element that opposes the first conductive element. A power supply controller can be configured to control the power supply to generate a voltage potential between the first and second conductive elements to apply an electric field across at least one of the first substrate and the second substrate to attract at least one of the 2D material and the first substrate towards the surface of the second substrate. A separator can be configured to separate the first substrate from the 2D material in contact with the surface of the second substrate.

In some embodiments, the first and second print force applicators include one of (i) a first roller and a second roller, (ii) a roller and a plate, and (iii) a first plate and a second plate, (iv) a first set of rollers with a first conveyor belt and a second set of rollers with a second conveyor belt, and (v) a first set of rollers with a conveyor belt and a plate. The first conductive element can be the first force applicator, a conductive plate or film included in the first force applicator, or the first substrate. The second conductive element can be the second force applicator, a second conductive plate or film included in the second force applicator, and a separate metallic foil received by the second force applicator concurrently with the second substrate.

In some embodiments, the printing device can further include a pre-oxidation chamber configured to oxidize a surface of a first substrate received by the first force applicator to weaken an attraction force between the 2D material associated with the first substrate and the surface of the first substrate. The printing device can further include a heating element configured to heat a second substrate received by the second force applicator to a temperature corresponding to a rubbery state of the second substrate. In some embodiments, the heating element can be configured to heat the second substrate to a temperature that is greater than a glassy transition temperature of the second substrate and less than a melting point of the second substrate.

In one exemplary embodiment of an electromechanical transfer printing system, the printing device can include a first force applicator configured to receive a first substrate having a 2D material disposed thereon and a second force applicator configured to receive a second substrate. The second force applicator can be opposed to the first force applicator such that a first substrate having a 2D material disposed thereon received by the first force applicator and a second substrate received by the second force applicator can be disposed between the first and second force applicators. The printing device can further include one or more controllers configured to control the first and second force applicators to apply a mechanical force or a mechanical pressure to at least one of the first and second substrates and an electrostatic force between the first and second substrates to facilitate a direct transfer of the 2D material from the surface of the first substrate to a surface of the second substrate without etching and without use of an adhesive.

In some embodiments, the printing device can further include a power supply and the one or more controllers can be configured to control the power supply to apply an electric field across at least one of the first substrate and the second substrate to produce the electrostatic force. The one or more controllers can be configured to control the first force applicator and the second force applicator to apply a mechanical force or a mechanical pressure that presses at least one of the first substrate and the second substrate towards the other to place the 2D material disposed on the first substrate in contact with a surface of the second substrate.

In some embodiments, the printing device can further include a separator configured to separate the first substrate from the 2D material in contact with the surface of the second substrate. The printing device can include a heating element and the one or more controllers can be configured to control the heating element to heat the second substrate received by the second force applicator to a temperature corresponding to a rubbery state of the second substrate. In some embodiments, the printing device can include a pre-oxidation chamber configured to oxidize a surface of a first substrate received by the first force applicator to weaken an attraction force between the 2D material associated with the first substrate and the surface of the first substrate.

One exemplary embodiment of a method of printing includes receiving a two-dimensional (2D) material disposed on a surface of a first substrate and receiving a second substrate. The method further includes transferring the 2D material to a surface of the second substrate by applying a mechanical force or a mechanical pressure that presses at least one of the first substrate and the second substrate towards the other to place the 2D material disposed on the first substrate in contact with the surface of the second substrate, and applying an electric field across at least one of the first substrate and the second substrate to attract at least one of the 2D material and the first substrate towards the surface of the second substrate. The method further includes separating the first substrate from the 2D material in contact with the surface of the second substrate. In some embodiments, the mechanical force and the electric field can be applied concurrently. The mechanical force can be equal to or greater than about 100 N/m. The mechanical pressure can be equal to or greater than about 100 kPa. The strength of the electric field can be equal to or greater than about 100 V/$\mu$m.

In some embodiments, the second substrate can be a polymer, and transferring the 2D material to the surface of the second substrate can further include controlling a temperature of the second substrate to transition the second substrate into a rubbery state to soften the surface of the second substrate. The temperature can be controlled to be greater than a glassy transition temperature of the second substrate and less than a melting point of the second substrate.

In some embodiments, the first substrate can be a metal, and the method can further include oxidizing the surface of the first substrate to weaken an attractive force between the 2D material and the surface of the first substrate prior to transferring the 2D material to the surface of the second substrate. In some embodiments, the method can further include smoothing the surface of the first substrate to have an average roughness or an rms roughness of 100 nm or less prior to disposing the 2D material thereon to facilitate separation of the 2D material from the surface of the first substrate after the 2D material is attached to the second substrate.

In some embodiments, the first substrate can be a metal substrate (e.g., copper) and the second substrate can be a polymer substrate (e.g., PET). In some embodiments, the second substrate can be a dielectric film having a thickness greater than 1 nm and less than 100 $\mu$m. The 2D material can be one or more of graphene, boron nitride (hBN), molybdenum disulfide ($MoS_2$), tungsten diselenide ($WSe_2$), and fluorographene. In some embodiments, the 2D material can be disposed on the first substrate by performing chemical vapor deposition.

In some embodiments, the 2D material can be transferred directly from the first substrate to the second substrate without etching and without use of an adhesive.

BRIEF DESCRIPTION OF THE DRAWINGS

The accompanying drawings, which are incorporated herein and constitute part of this specification, illustrate exemplary embodiments, and together with the general description given above and the detailed description given below, serve to explain the features of the various embodiments.

DETAILED DESCRIPTION

Certain exemplary embodiments will now be described to provide an overall understanding of the principles of the structure, function, manufacture, and use of the systems, devices, and methods disclosed herein. One or more examples of these embodiments are illustrated in the accompanying drawings. Those skilled in the art will understand that the systems, devices, and methods specifically described herein and illustrated in the accompanying drawings are non-limiting exemplary embodiments and that the scope of the present disclosure is defined solely by the claims. The features illustrated or described in connection with one exemplary embodiment may be combined with the features of other embodiments. Such modifications and variations are intended to be included within the scope of the present disclosure. In the present disclosure, like-numbered components of various embodiments generally have similar features when those components are of a similar nature and/or serve a similar purpose. A person skilled in the art, in view of the present disclosure, will understand various instances in which like-numbered components across various figures are akin.

The present disclosure is directed to various systems, devices, and methods configured to perform electromechanical transfer printing of 2D materials (e.g., graphene) from a source substrate (e.g., a copper foil) to a target substrate (e.g., polymer). Various embodiments of the printing device can be configured to transfer a layer or pattern of 2D material from a source substrate to the target substrate by applying a combination of mechanical and electrostatic forces to facilitate electromechanical adhesion between the 2D material layer and the target substrate. Embodiments of the printing device can produce such electromechanical adhesion, such that the work of adhesion between the 2D material and the target substrate exceeds the work of adhesion between the 2D material and the source substrate. Accordingly, some embodiments of the printing device can effect direct transfer printing of a 2D material from a source substrate to a target substrate without the use of etchants and adhesives (e.g., SCOTCH® tape, epoxies, etc.). In some embodiments, the mechanical adhesion produced by contact between the 2D material layer and the target substrate can be improved by heating the target substrate to a rubbery or viscous state, which facilitates increased surface contact between the 2D material layer and the target substrate. In some embodiments, a pre-oxidization process can be performed on the source substrate with the 2D material previously disposed thereon to reduce the work of adhesion therebetween and thus facilitate a reduction in the mechanical and electrostatic force requirements to effect transfer of the 2D material layer to the target substrate.

Figure 1A:
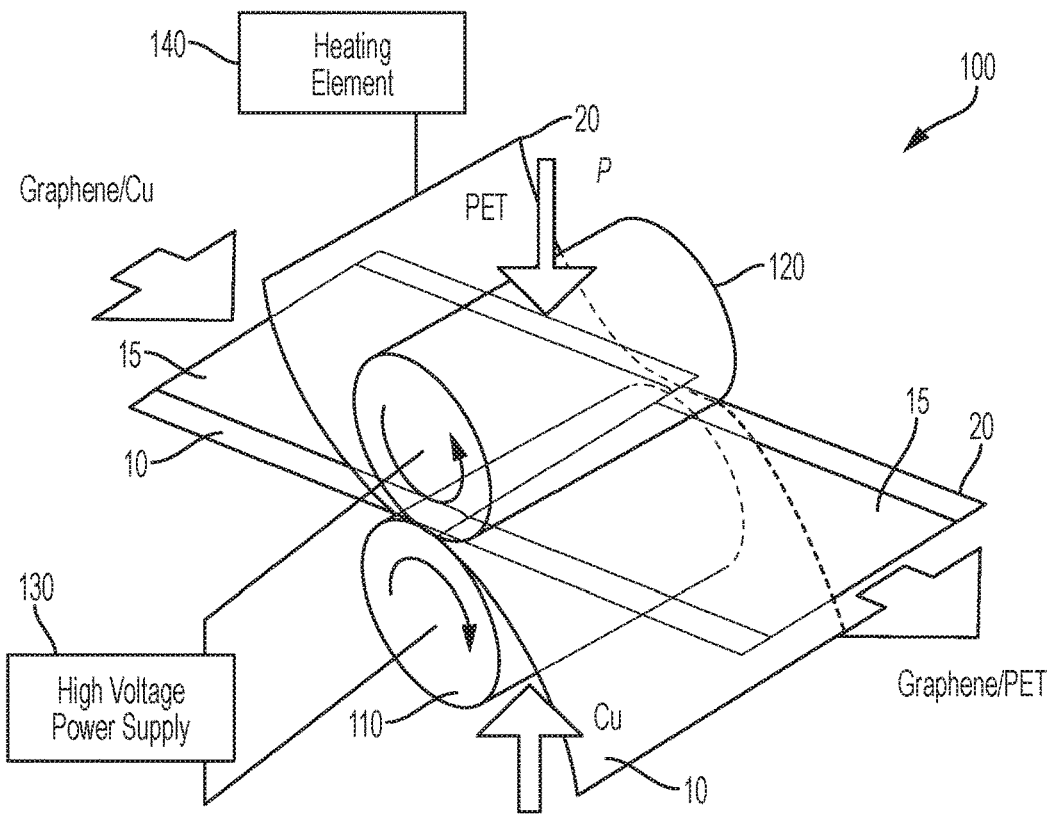
FIG. 1A is a schematic illustration of one exemplary embodiment of an electromechanical transfer printing device for 2D materials.
Figure 1B:
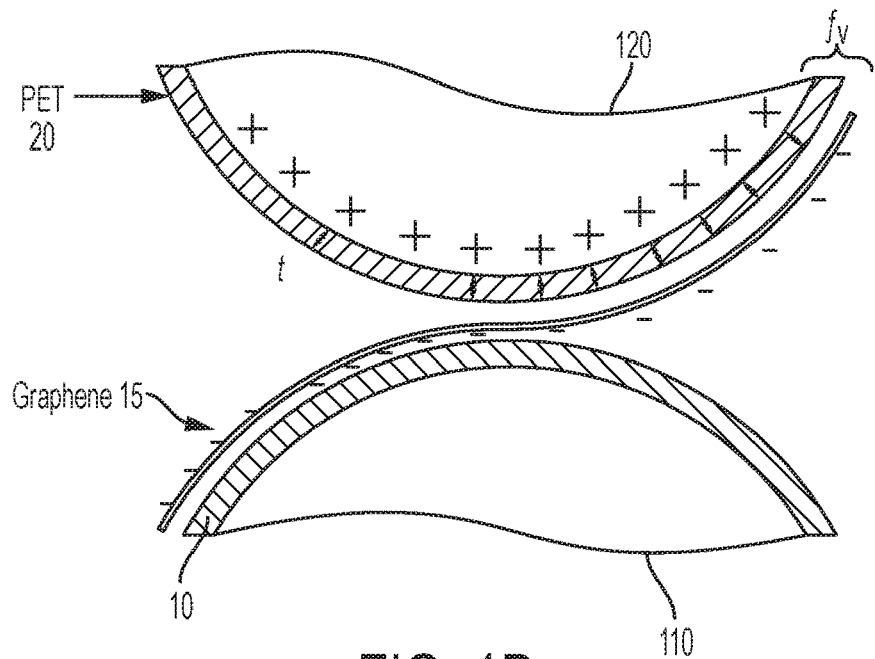
FIG. 1B is a schematic illustration showing the printing device of FIG. 1A performing a direct transfer printing of a 2D material disposed on a source substrate onto a target substrate.

FIGS. 1A and 1B are schematic illustrations of one exemplary embodiment of an electromechanical transfer printing device 100 configured to perform direct transfer printing of a 2D material disposed on a source substrate to a target substrate. The printing device 100 can include a first force applicator 110, a second force applicator 120, a high voltage power supply 130, and a heating element 140. The first force applicator 110 can be configured to receive a sheet of a source substrate 10 having a 2D material 15 disposed thereon from an input of the printing device 100, while the second force applicator 120 can be configured to receive a sheet of a target substrate 20 to which the 2D material is transferred. The second force applicator 120 can be configured to oppose the first force applicator 110 such that the source substrate 10 and the target substrate 20 can be disposed and/or pass between the first and second force applicators 110, 120. As shown in the illustrated embodiment, the first and second force applicators 110, 120 can be cylindrical rollers. In some embodiments, the force applicators can be include a cylindrical roller and a flat plate, a plate and a roller, or a first plate and a second plate, respectively.

One or both of the force applicators 110, 120 can be configured and/or controlled to apply a mechanical force (or pressure P) that presses the source substrate 10, the target substrate 20, or both towards the other. As the substrates are pressed together, the 2D material disposed on the source substrate 10 is placed in contact with an opposing surface of the target substrate 20. When the 2D material 15 and the target substrate 20 are pressed together with a sufficient mechanical force, surface deformities or asperities may form in the 2D material 15 and/or the target substrate 20, causing the opposing surfaces to interlock or otherwise engage. Mechanical adhesion is produced by such surface contact between the 2D material 15 and the target substrate 20.

The strength of mechanical adhesion can depend, at a microscopic level, on the actual contact area between the 2D material 15 and the target substrate 20. As discussed in more detail below, in some embodiments, the heating element 140 can be configured and/or controlled to heat the target substrate 20 a temperature t that softens the contact surface of the substrate. By softening the surface of the target substrate 20, the degree of mechanical contact between the 2D material 15 and the target substrate 20 (e.g., increased contact ratio) can increase, and thereby improve the strength of the mechanical adhesion between the opposing contact surfaces.

In some embodiments, the heating element 140 can be a heated oven or chamber through which the target substrate 20 passes prior to entry to the printing device 100. In some embodiments, the heating element 140 can be ceramic or other thermally conductive heater arranged above or below the target substrate 20 as its passes between the force applicators 110, 120 of the printing device 100.

For some combinations of 2D materials and substrates, the force applicators 110, 120 of the printing device 100 can apply a sufficient mechanical force to effect a transfer of a 2D material from one substrate to another by mechanical adhesion substantially alone. For example, when the work of mechanical adhesion induced between the 2D material 15 and the target substrate 20 by the force applicators 110, 120 is greater than the work of mechanical adhesion between the 2D material 15 and the source substrate 10, the source substrate 10 can be separated from the 2D material 15, e.g., by gravity or a pulling force, while the 2D material continues to adhere by mechanical contact to the target substrate 20. However, in some applications, mechanical adhesion alone can be insufficient to effect a transfer of the 2D material from one substrate to another. For example, in the illustrated embodiment, mechanical force alone can be insufficient to effect a transfer of a graphene layer disposed on a copper foil to a target polyethylene terephthalate (PET) film, at least without causing damage to the graphene layer or PET film.

In order to augment the mechanical adhesion between the graphene layer 15 and PET film 20 to exceed the mechanical adhesion between the graphene layer 15 and the copper foil 10, the high voltage power supply 130 can be configured and/or controlled to apply an electric field $f_v$, which induces an electrostatic force to attract the graphene layer 15 towards the target PET film 20. The combination of electrostatic adhesion produced by the electric field and the mechanical adhesion produced by the force applicators 110, 120 is referred to herein as electromechanical adhesion.

While the electromechanical adhesion applied between the graphene layer 15 and the PET film 20 exceeds the mechanical adhesion between the graphene layer 15 and the copper foil 10, the copper foil can be readily separated from the graphene layer 15 and the PET film 20 can exit the printing device 100 with the graphene layer 15 disposed thereon, as shown in FIGS. 1A and 1B for example. In some embodiments, the copper foil 10 can be recycled and/or reused as a source substrate. After the copper foil 10 is removed from the graphene layer 15 and the graphene/PET film 15, 20 exits the electric field, the graphene layer 15 remains disposed on the PET film 20 by mechanical adhesion by contact.

Figure 2:
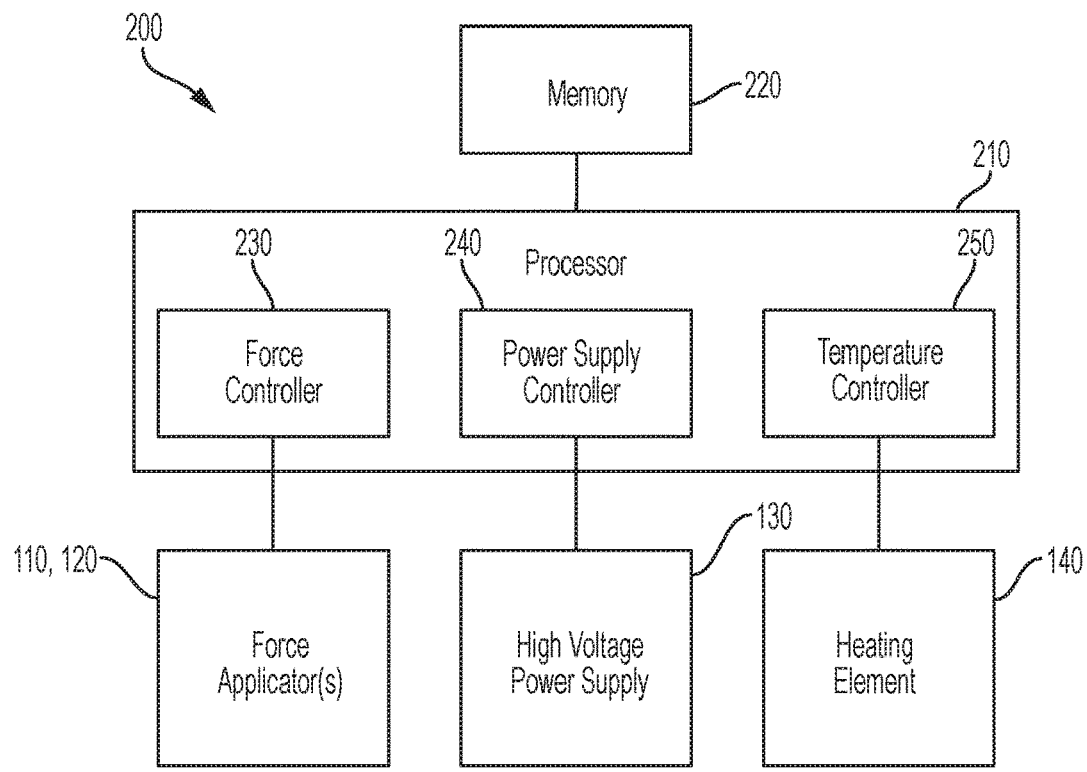
FIG. 2 is a schematic diagram of one exemplary embodiment of components of a computing device that may be operated in conjunction with the electromechanical transfer printing device of FIG. 1A.

FIG. 2 is a schematic diagram of one exemplary embodiment of components of a computing device 200 that may be operated in conjunction with an electromechanical transfer printing device (e.g., 100). The computing device 200 can include various circuits and other electronic components used to power and control the operation of the computing device 200. The computing device 200 can include at least a processor 210 and memory 220.

In some embodiments, the processor 210 may be any programmable microprocessor, microcomputer, microcontroller, or multiple processor chip or chips that can be configured by software instructions (e.g., applications) to perform a variety of functions, including the functions of a force controller 230, a high voltage power supply controller 240, and a temperature controller 250. For example, the force controller 230 can be configured to control one or more of the force applicators 110, 120 to apply and maintain a mechanical force or pressure between the source and target substrates 10, 20. The power supply controller 240 can be configured to control the high voltage power supply 130 to generate a voltage potential in order to apply and maintain a target electric field $f_v$ across one or more of the substrates 10, 20. The temperature controller 250 can be configured to monitor and control the heating element 140 to heat and maintain the target substrate 20 at a desired temperature (e.g., greater than a glassy transition temperature). In some embodiments, the individual controllers 230, 240, and 250 can be implemented as a single controller. In some embodiments, the one or more controllers 230, 240, and 250 can be implemented as one or more processing devices or modules separate from the processor 210. The software instructions and/or software applications may be stored in the memory 220 before they are accessed and loaded into the processor 210. The processor 210 may additionally or alternatively include internal memory sufficient to store such software instructions and/or applications.

The memory 220 may store processor-executable instructions. The memory 220 may also store data obtained or measured by the processor 210 associated with the operation of the force applicator(s) 110, 120, the high voltage power supply 130, the heating element 140, or any combination thereof. The memory 220 may be volatile memory (e.g., random access memory or RAM), non-volatile memory (e.g., flash memory), or a combination thereof. The memory 220 may include internal memory included in the processor 210, memory external to the processor 210, or any combination thereof. In some embodiments, the processor may store data output directly from various sensing devices (e.g., force sensors, voltage or current sensors, and/or temperature sensors) in the memory 220 for subsequent access by the force controller 230, power supply controller 240, temperature controller 250, or any combination thereof.

A person skilled in the art, in view of the present disclosures, will understand how to implement the computing device 200, or at least various components thereof, into the various systems (e.g., printing device 100) provided for herein without departing from the spirit of the present disclosure.

Figure 3:
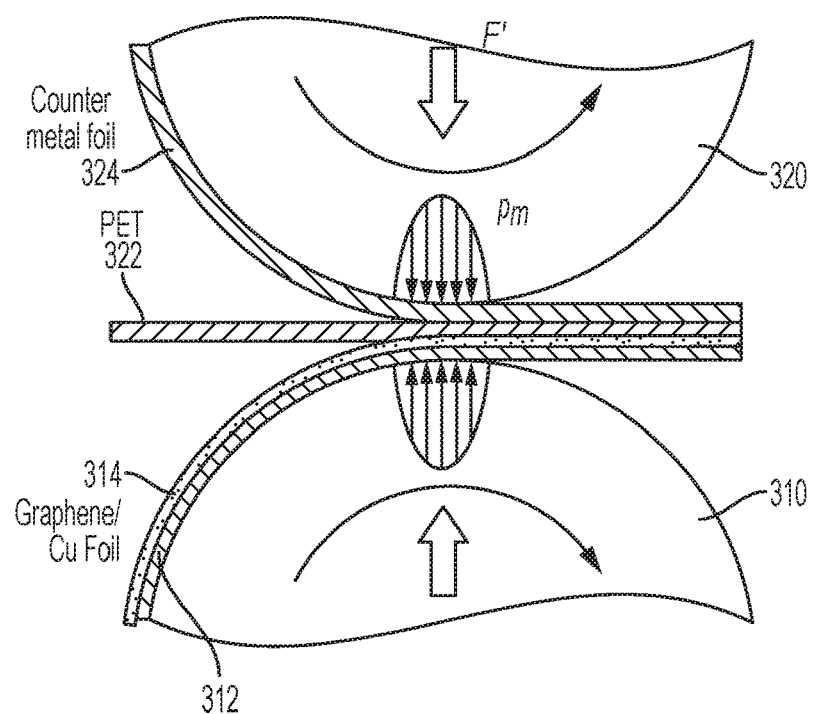
FIG. 3 is a schematic illustration of one exemplary embodiment of opposing force applicators of the printing device of FIG. 1A applying a mechanical force to mechanically adhere a 2D material layer disposed on a source substrate to a target substrate.

FIG. 3 is a schematic illustration of one exemplary embodiment of the force applicators suitable for use in the electromechanical transfer printing device of FIG. 1A. As shown, the force applicators can include a first cylindrical roller 310 and a second cylindrical roller 320. The first roller 310 can be configured to receive a sheet of copper foil 312 having a layer or pattern of graphene 314 disposed thereon. The second roller 320 can be configured to receive a sheet of a PET film 322 to which the graphene layer 314 is transferred. As discussed further below with respect to FIG. 4, the second roller 320 can also be configured to receive a sheet of a counter metal foil 324 to facilitate application of the electric field $f_v$.

The second roller 320 can be configured to oppose the first roller 310 such that the graphene 314/copper foil 312 and the PET film 322 can be pressed into contact by a mechanical force F' (or mechanical pressure $p_m$) applied between the first and second rollers 310, 320. In some embodiments, a force controller (e.g., 230) can control one or both of the rollers 310, 320 to apply a mechanical force F' that is sufficient to provide mechanical adhesion between the graphene layer 314 and the PET film 322 by mechanical contact of their respective surfaces. As discussed above, surface deformities or asperities can form in the opposing contact surfaces of the graphene layer 314 and the PET film 322 under an applied mechanical force, and thereby cause the opposing contact surfaces of the graphene layer 314 and the PET film 322 to mechanically interlock or engage.

In some embodiments, the rollers 310, 320 can be configured or controlled to apply a mechanical force F' equal to or greater than about 100 N/m or a mechanical pressure $p_m$ equal to or greater than about 100 kPa. In some embodiments, the mechanical force F' or mechanical pressure $p_m$ applied by the rollers 310, 320 can be limited to select magnitude ranges that are sufficient to induce at least a minimum level of mechanical adhesion without causing significant deformation or other damage to the graphene layer 314 and/or the PET film 322. In some embodiments that use different 2D materials and substrate types, the rollers 310, 320 can be configured or controlled to apply a mechanical force F' or mechanical pressure $p_m$ different magnitude ranges.

In some embodiments, one or more of the rollers 310, 320 can be controlled using a force controller (e.g., 230) that directs the linear motion of the rollers along an axis normal to the opposing contact surfaces of the copper foil 312 and PET film 322. The force controller (e.g., 230) can use a force or pressure sensor (not shown) to measure the force or pressure applied to source and target substrates 312, 322 and use such measurements as feedback for monitoring and maintaining the applied force/pressure within a predetermined limits.

As discussed above, in some applications, mechanical adhesion alone can be insufficient to effect a direct transfer of a graphene layer 314 from a copper foil 312 to a target PET film 322 without damaging or significantly deforming the graphene layer and/or the PET film. In order to augment the mechanical adhesion between the graphene layer 314 and PET film 322 in a manner that avoids such damage, the printing device 100 can be configured to apply an electric field that induces electrostatic adhesion between the graphene layer 314 and the target PET film 322.

Figure 4:
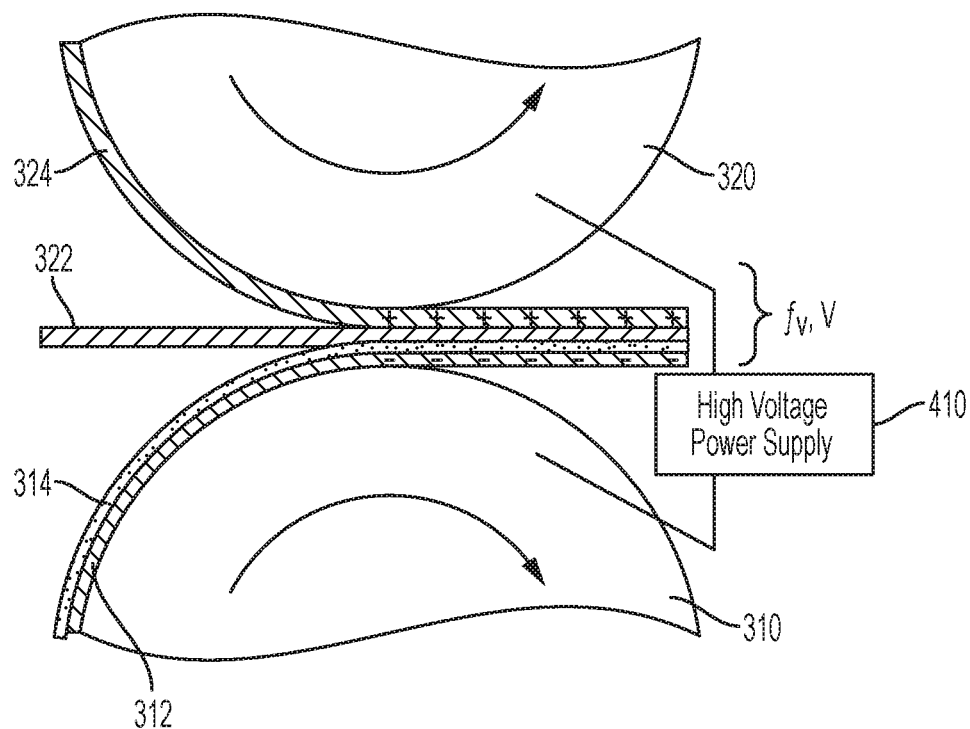
FIG. 4 is a schematic illustration of one exemplary embodiment of a high voltage power supply of the printing device of FIG. 1A applying an electric field to electrostatically attract a 2D material layer disposed on a source substrate towards the target substrate.

FIG. 4 is a schematic illustration of one exemplary embodiment of a high voltage power supply 410 applying an electric field $f_v$ to induce electrostatic adhesion between the graphene layer 314 and the target PET film 322. The combination of the electrostatic adhesion produced by electric field $f_v$ and the mechanical adhesion by contact produced by the mechanical force F' applied between the graphene layer 314 and the PET film 322 can be referred to as electromechanical adhesion. In some embodiments, the high voltage power supply 410 can be configured to apply the electric field $f_v$ across at least the coil foil 312, the graphene layer 314, and the PET film 322. In some embodiments, the high voltage power supply 410 can be configured to apply the electric field $f_v$ across at least the graphene layer 314 and the PET film 322.

In some embodiments, the high voltage power supply 410 can be configured to apply an electric field $f_v$ of sufficient magnitude, such that the electrostatic adhesion between the graphene layer 314 and the PET film 322 in combination with the mechanical adhesion by contact exceeds the mechanical adhesion between the graphene layer 314 and the copper foil 312. When the electromechanical adhesion between the graphene layer 314 and the PET film 322 is greater than the adhesion between the graphene layer 314 and the copper foil 312, the copper foil 312 can be readily separated from the graphene layer 314 (e.g., by van der Waals attraction, etc.).

In some embodiments, the high voltage power supply 410 can be configured or controlled to apply an electric field $f_v$ having a magnitude that is equal to or greater than about 100 V/μm. In some embodiments in which different 2D materials and substrates are used, the high voltage power supply 410 can be configured or controlled to apply an electric field $f_v$ having different magnitudes so that the electromechanical adhesion between the 2D material and the target substrate can exceed the mechanical adhesion between the 2D material and the source substrate.

In some embodiments, the electric field $f_v$ can be generated by the high voltage power supply 410 applying a voltage potential V between various combinations of conductive elements of the printing device 100. For example, as shown in the illustrated embodiment, the high voltage power supply 410 can be configured to apply a voltage potential V between the copper foil 312 and the counter metal foil 324, such that the copper foil 312 has a negatively-charged polarity and the counter metal foil 324 has a positively-charged polarity. In response to the applied voltage potential V, an electric field $f_v$ can be generated and applied between at least the metal foils 312, 324.

In some embodiments, the voltage potential V can be applied by terminals of the high voltage power supply 410 directly to the metal foils 312, 314. In some embodiments, where one or more of the rollers are made of conductive materials, the voltage potential V can be applied by terminals of the high voltage power supply 410 to the rollers 310, 320, which generates and applies the electric field $f_v$ between the rollers 310, 320. In some embodiments, the counter metal foil 324 can be omitted, such that the electric field is generated and applied between the first roller 310 or the copper foil 312 and the second roller 320.

In some embodiments, the thickness of the target substrate (e.g. PET or glass) 322 can be controlled to achieve a high electric field between the contact interface at low applied voltages. For example, in some embodiments, by reducing a thickness of a dielectric substrate in half, the strength or magnitude of the electric field can be doubled with the same amount of applied voltages. Thus, by using a target substrate having a relatively thin thickness, an electric field having a desired magnitude or strength can be induced at lower applied voltages. In some embodiments, the target substrate can have a thickness that is greater than 1 nm and less than 100 μm.

In some embodiments, the voltage potential V can be applied by terminals of the high voltage power supply 410 directly to the metal foils 312, 314. In some embodiments, where one or more of the rollers are made of conductive materials, the voltage potential V can be applied by terminals of the high voltage power supply 410 to the rollers 310, 320, which generates and applies the electric field $f_v$ between the rollers 310, 320. In some embodiments, the counter metal foil 324 can be omitted, such that the electric field is generated and applied between the first roller 310 or the copper foil 312 and the second roller 320.

As the copper foil 312 and the PET film 322 are pressed together by the rollers 310, 320, the electric field $f_v$ can induce an electrostatic force that attracts the graphene layer 314 towards the PET film 322, thereby providing an electrostatic adhesion therebetween. The electrostatic adhesion is in addition to the mechanical adhesion produced by contact between the graphene layer 314 and the PET film 322. When such electromechanical adhesion between the graphene layer 314 and the PET film 322 exceeds the adhesion strength between the graphene layer 314 and the copper foil 312, the copper foil 312 can be readily separated from the graphene layer 314, such that the PET film 322 can exit an output side of the printing device 100 with the graphene layer disposed thereon, e.g., as shown in FIGS. 1A and 1B.

In some embodiments, the printing device can be configured to perform dual transfer printing of a 2D material. For example, in some embodiments, an additional layer of 2D material, such as graphene (not shown), can be disposed on the surface of the counter metal foil 324, such that the graphene layer can be transfer printed on both side surfaces of the PET film 322 or other target substrate.

Figure 5A:
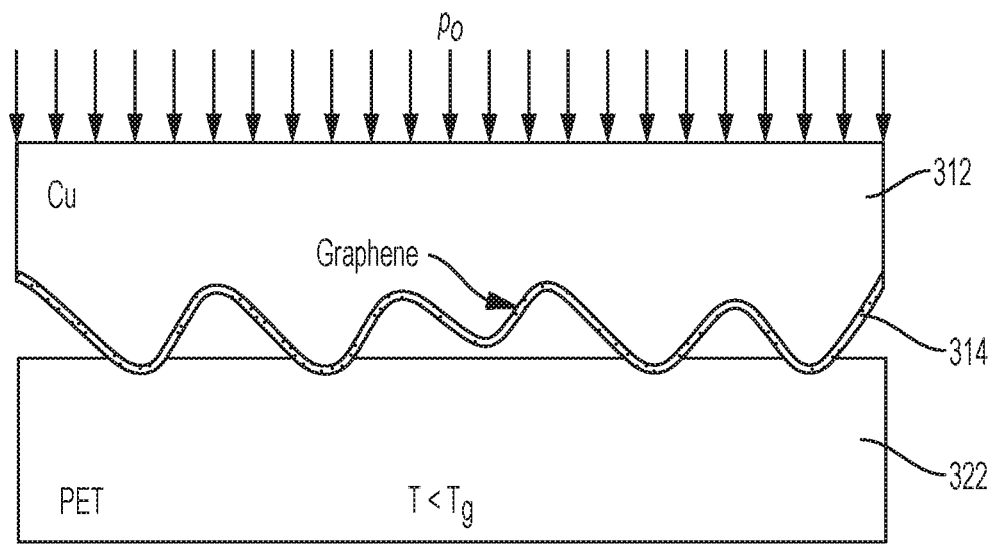
FIG. 5A is a schematic illustration showing the contact area between a 2D material disposed on a first substrate having a rough surface and a target substrate, where the target substrate is in a glassy state.

As previously discussed, the strength of mechanical adhesion by surface contact can depend, at a microscopic level, on the actual contact area between the 2D material layer and the target substrate. For example, as shown in FIG. 5A, when the surface of a graphene layer 314 is rough and the PET film 322 is in a hard glassy state, the actual contact area between the graphene layer and PET film can be less than the potential contact area between the contact surfaces. Thus, reduced contact area between the opposing surfaces of the graphene layer 314 and the PET film 322 can cause a corresponding reduction in the strength of the mechanical adhesion provided by a nominal mechanical force or pressure $p_0$.

Figure 5B:
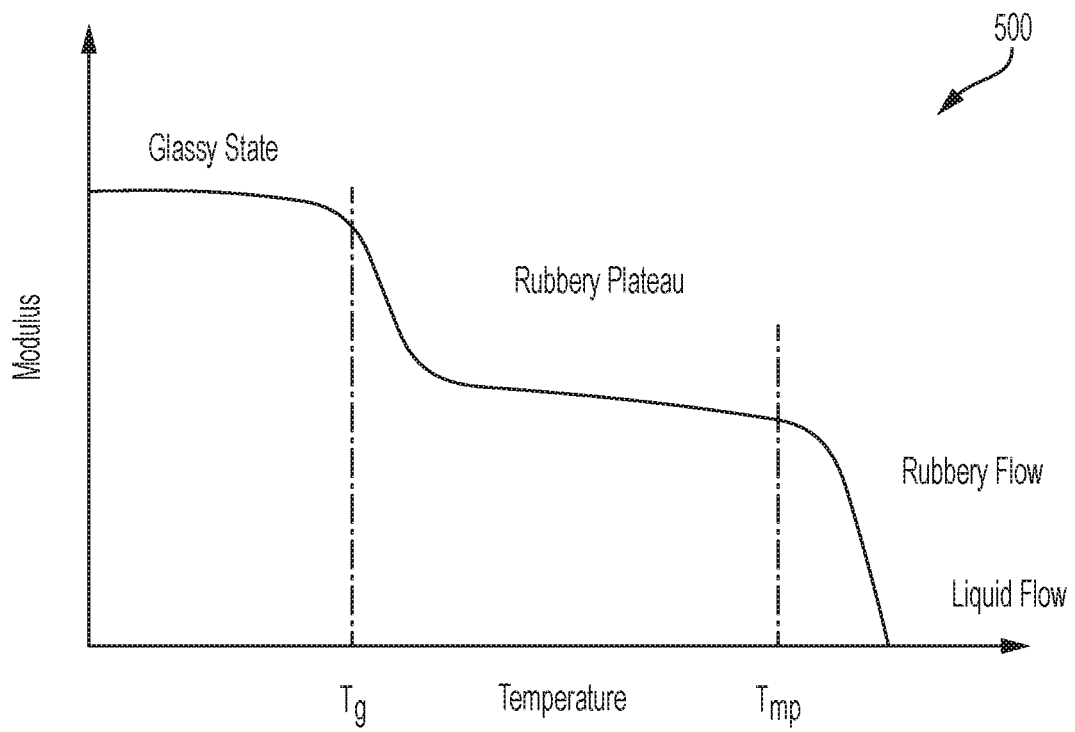
FIG. 5B is a graph illustrating one example of state transitions in the modulus of elasticity (e.g., glassy, rubbery, liquid) of a polymer substrate (e.g., PET) as a function of temperature.
Figure 5C:
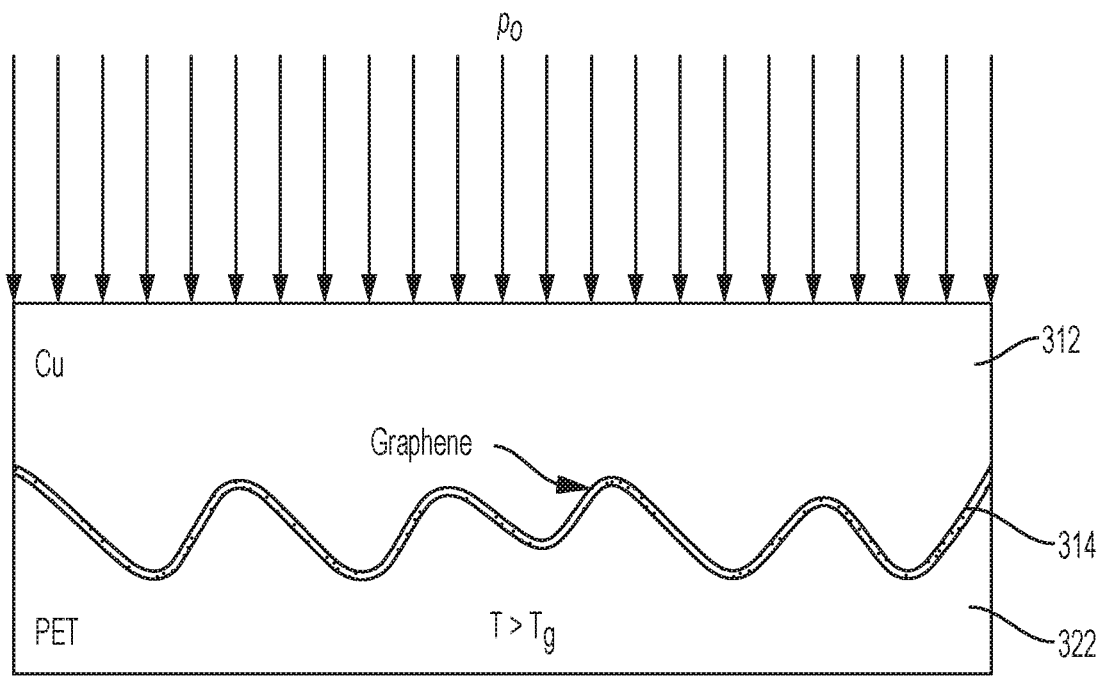
FIG. 5C is a schematic illustration showing an increase in the contact area between the 2D material disposed on the source substrate and the target substrate in a rubbery state.
Figure 5D:
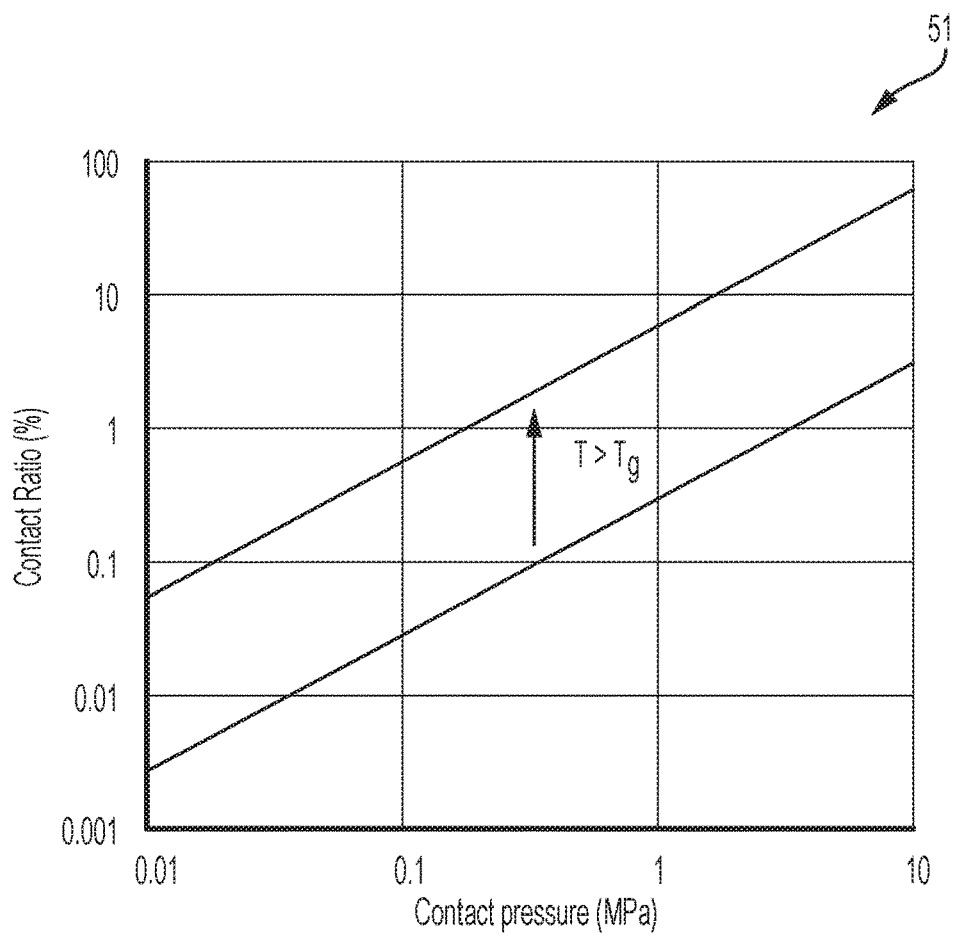
FIG. 5D is a graph illustrating one example of an increase in contact ratio between the 2D material and the target substrate as a function of temperature and contact pressure.

In some embodiments, to increase the actual contact area or contact ratio between the graphene layer 314 and the PET film 322, the temperature of the PET film 322 can be elevated to a temperature T that results in a temporary state transition of the PET film from a glassy state to a viscous or rubbery state. For example, FIG. 5B is a graph 500 illustrating one example of state transitions in the modulus of elasticity (e.g., glassy, rubbery, liquid) of a polymer, such as PET, as a function of temperature. As shown in the graph 500, PET can transition from a glassy state to a rubbery state by elevating the temperature of the PET film above its glassy transition temperature $T_g$, but less than its melting point temperature $T_{mp}$. In a rubbery state, as shown in FIG. 5C, the surface of the PET film 322 is softened to a degree that facilitates increased contact surface area (or contact ratio), and thus a corresponding increase in mechanical adhesion by surface contact. For example, FIG. 5D is a graph 510 illustrating one example of an increase in contact ratio between the 2D material and a polymer substrate (e.g., PET) as a function of temperature and contact pressure. As shown in the graph 510, elevating the temperature T of the PET film 322 above its glassy transition temperature $T_g$ can effect an increase in contact ratio, without requiring a corresponding increase in contact pressure (MPa).

In some embodiments, a heating element (e.g., 140 of FIG. 1) can be configured or controlled to heat the PET film 322 to a temperature that is greater than its glassy transition temperature $T_g$. In some embodiments, the PET film 322 can be heated to a temperature that is greater than about 70 degree ° C. and less than about 200 degrees ° C. In some embodiments, other temperature ranges can be used depending on the particular application and/or the state transition properties of the target substrate itself.

Figure 6:
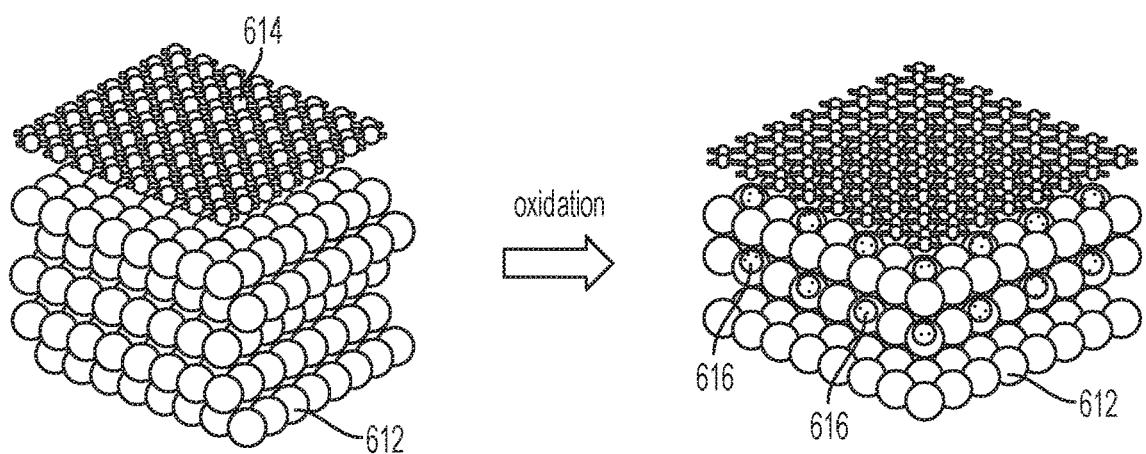
FIG. 6 is a schematic illustration showing the general concept of a pre-oxidation process to weaken an attractive force between a 2D material later (e.g., graphene) and a source substrate (e.g., copper) prior to electromechanical transfer printing of the 2D material.

FIG. 6 is a schematic illustration showing the general concept of oxidization of a source substrate having a 2D material layer disposed thereon. In some embodiments, it can be useful to oxidize a copper foil 612, such that oxygen atoms 616 disposed about the surface of the copper foil below the graphene layer 614, prior to transfer printing of the graphene layer onto a target substrate, such as PET film. By oxidizing the copper foil 612, attractive forces between the graphene layer 614 and the copper foil 612, such as a Van der Waals force, can weaken, and thereby reduce the adhesion strength therebetween. Thus, by oxidizing the copper foil 614, the mechanical force and/or the electrostatic force needed to effect the transfer printing of the graphene layer 614 onto the target substrate can be less than the force that would be needed to overcome the adhesion between the graphene layer 614 and the copper foil 612 without any pre-oxidizing process. In some embodiments, the pre-oxidization process can include placing the substrate and the 2D material disposed thereon is a water bath or a high humidity chamber at a temperature of 50 degrees ° C. for a duration of 1 to 24 hours. Other pre-oxidization processes known to one of ordinary skill in the art can also be used.

In some embodiments, to reduce the strength of adhesion between source substrate and the 2D material layer, it can also be useful to smooth the surface roughness of the source substrate prior to depositing the 2D material layer thereon. For example, the source substrate can be polished using various types of abrasives to smooth the surface roughness of the substrate. In some embodiments, the surface of a copper foil source substrate can be smoothed to a surface roughness Ra or $R_{RMS}$ in a range equal or less than 100 nm. Smoothing the surface roughness of the source substrate can reduce the mechanical adhesion between the smoothed surface of the source substrate and the 2D material disposed thereon.

Figure 7A:
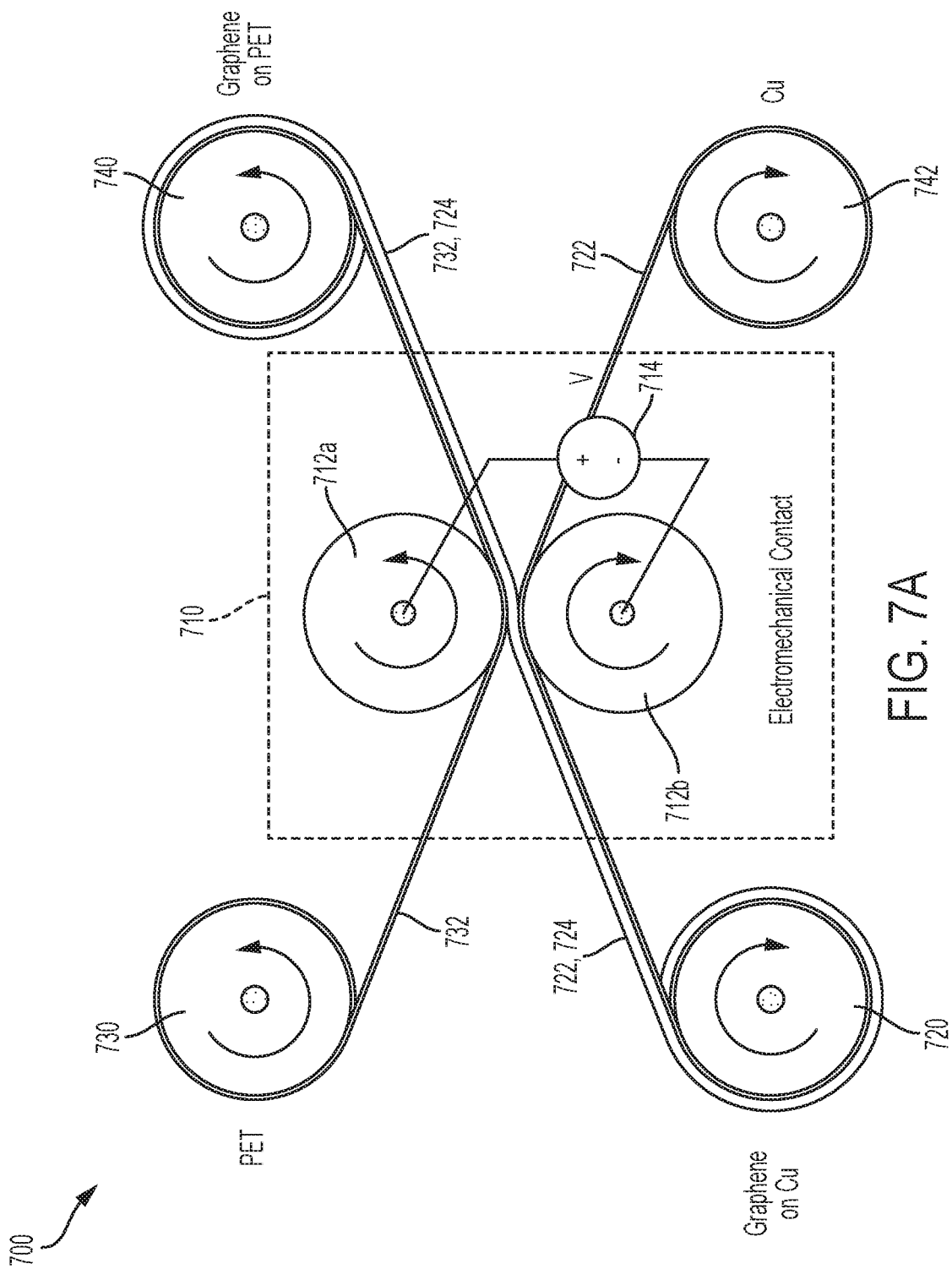
FIG. 7A is a schematic illustration of one exemplary embodiment of an electromechanical transfer printing system for 2D materials.

FIG. 7A is a schematic illustration of one exemplary embodiment of an electromechanical transfer printing system 700 for 2D materials. The structure and operation of a roll-to-roll printing device 710 is substantially similar to the structure and operation of the printing device 100. A detailed description of the structure and function thereof is thus omitted here for the sake of brevity.

As shown in the illustrated embodiment, a continuous sheet of a source substrate (e.g., copper) 722 having a 2D material layer (e.g., graphene) 724 can be input to the roll-to-roll printing device 710 from a first source 720. A continuous sheet of the target substrate (e.g., PET film) 732 can be input to the printing device 710 from a second source 730. The source substrate 722 and the target substrate 732 can roll out from their respective sources 720, 730 into the printing device 710. As discussed above with respect to FIG. 6, in some embodiments, a pre-oxidation process can be performed on the source substrate 722 prior to being supplied to the source 720.

The printing device 710 can include rollers as force applicators 712a, 712b and a high voltage power supply 714, connected to the conductive rollers or to conductive roller surfaces, that are collectively configured to electromechanically adhere the 2D material layer 724 to the target substrate 732 in a manner substantially similar to operation of the printing device 100 described above with respect to the printing FIGS. 1A-6. As discussed above with respect to FIG. 1A, the printing device 710 can include a heating element (not shown) to heat the target substrate 732 to a temperature that improves the mechanical contact between the target substrate and the 2D material later 724 during transfer printing.

The system 700 can also include a first output roller 740 and a second output roller 742 configured to separate the source substrate 722 from the 2D material layer 724 that is in electromechanical contact with the surface of the target substrate 732. In operation, the first output roller 740 can pull the target substrate 732 from an output side of the printing device 710 with a pulling force in at least one axial direction (e.g., upward direction), while the second output roller 742 can pull the source substrate 722 from the output side of the printing device 710 with a pulling force in an opposing axial direction (e.g., downward direction). When the substrates exit the printing device 710, the source substrate 722 exits the device with its 2D material layer transferred onto the target substrate 732. In some embodiments, the first output roller 740 can store the sheets of target substrate 732 and 2D material 724 for a next manufacture phase. In some embodiments, the second output roller 742 can store the sheet of source substrate 722 for recycling or reuse of the source substrate. In some embodiments, the 2D material layer can be transferred from the source substrate 722 to the target substrate 732, while the substrate sheets pass between the force applicator rollers 712a, 712b at a range of speeds, e.g., between 12 meters per minute (m/min) to 0.12 m/min.

Figure 7B:
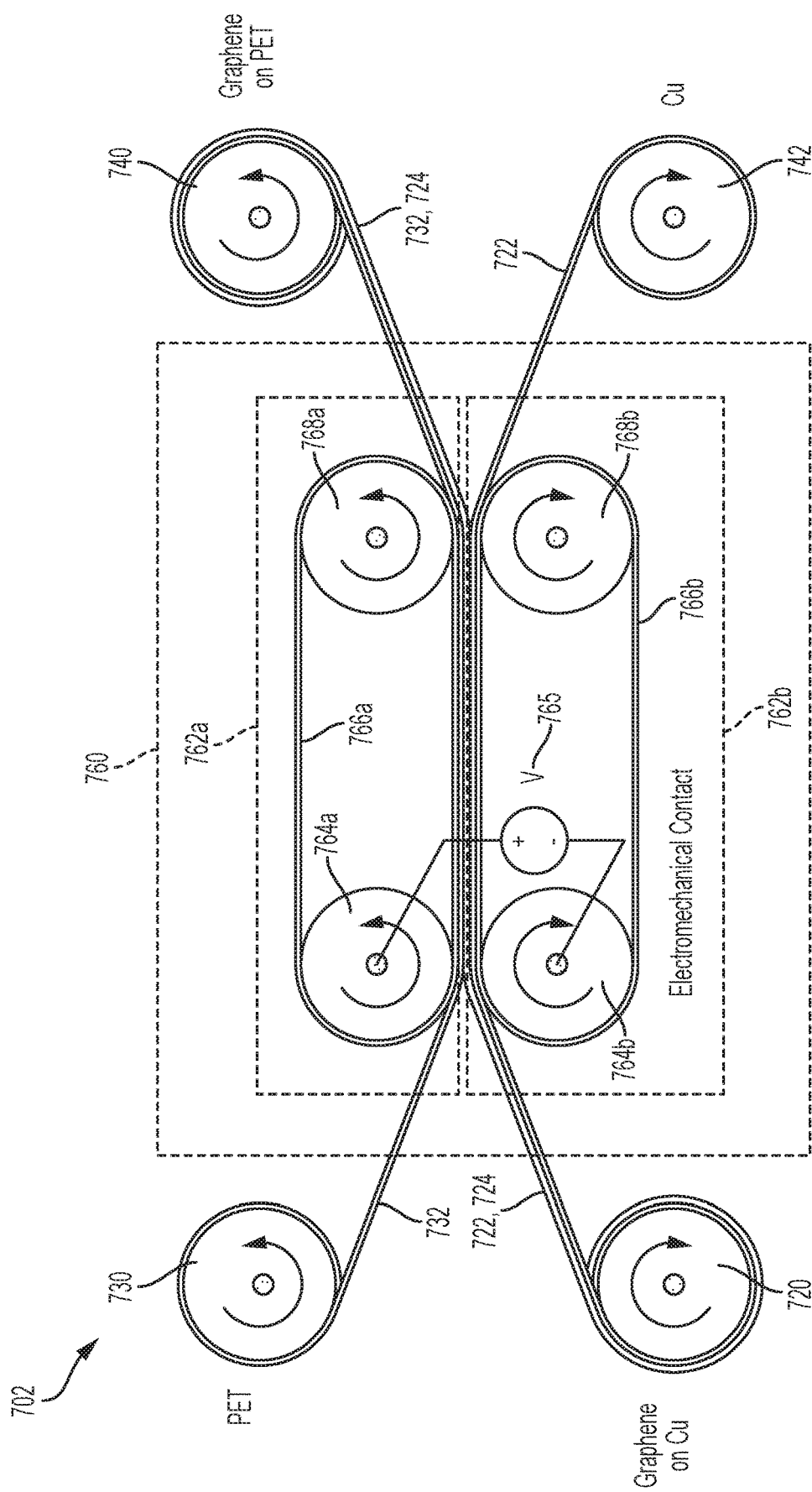
FIG. 7B is a schematic illustration of another exemplary embodiment of an electromechanical transfer printing system for 2D materials.

FIG. 7B is a schematic illustration of another exemplary embodiment of an electromechanical transfer printing system 702 for 2D materials. The printing device 760 can include rollers with conveyor belts 762a, 762b and a high voltage power supply 765, connected to conductive rollers or to conductive conveyor belts (e.g. metal foils), configured to electromechanically adhere the 2D material layer 724 to the target substrate 732 in a manner substantially similar to operation of the printing device 100 described above with respect to the printing FIGS. 1A-6. The source substrate 722, the target substrate 732, and the 2D material layer 724 therebetween enters the force applicator rollers 764a 764b, applying mechanical and electrostatic forces as illustrated in FIGS. 3 and 4. In some embodiments, the conveyor belts 766a and 766b can be conductive and/or otherwise configured to maintain the voltage potential applied by the high voltage power supply 714. By applying the voltage potential between the conveyor belts 766a and 766b, the electric field can be maintained across the source and target substrates 722, 732 to provide the electrostatic attraction forces that further enhance the adhesion between the target substrate 732 and the 2D material layer 724 along a path towards a pair of opposing separator rollers 768a and 768b.

The target substrate 732 can be coupled between one of the separator rollers 768a and a first output roller 740, while the source substrate 722 can be coupled between the other separator roller 768b and a second output roller 742. In operation, the first output roller 740 can pull the target substrate 732 from an output side of the printing device 760 with a pulling force in at least one axial direction (e.g., upward direction), while the second output roller 742 can pull the source substrate 722 from the output side of the printing device 760 with a pulling force in an opposing axial direction (e.g., downward direction). When the substrates exit the printing device 710, the source substrate 722 exits the device with its 2D material layer transferred onto the target substrate 732.

Figure 8:
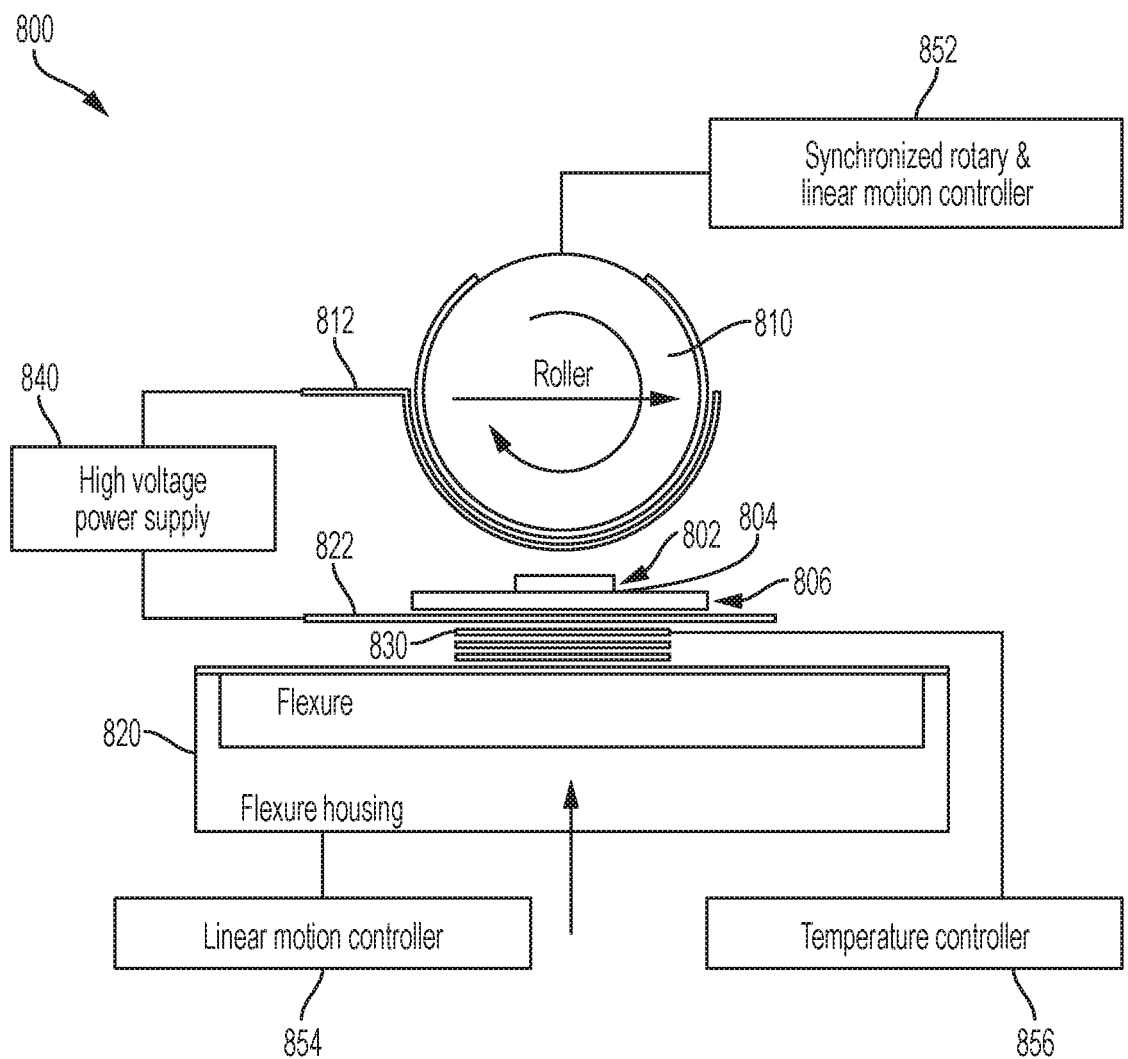
FIG. 8 is a schematic illustration of another exemplary embodiment of an electromechanical transfer printing device for 2D materials.

FIG. 8 is a schematic illustration of one exemplary embodiment of a roll-to-plate, electromechanical transfer printing device 800. The printing device 800 can include a force applicator roller 810, a force applicator plate 820, a high voltage power supply 830, and a heating element 840.

In the illustrated embodiment, the force applicator roller 810 can be configured to oppose the force applicator plate 820. A sheet of a source substrate 802 having a 2D material layer 804 disposed thereon and a target substrate 806 can be positioned between the force applicator roller 810 and the force applicator plate 820, such that the 2D material layer 804 is in contact with the target substrate 806. In some embodiments, the force applicator plate 820 can be implemented as a flexure housing or other flat plate-like structure capable of exerting a mechanical force in an axial direction. In some embodiments, the force applicators can each be a force applicator plate.

One or both of the roller 810 or the plate 820 can be configured and/or controlled to apply a mechanical force or pressure that presses the source substrate 802, the target substrate 806, or both towards the other. In some embodiments, the roller 810 can be controlled by a synchronized rotary and linear motion controller 852 and the plate 820 can be controlled by a linear motion controller 853. As the substrates are pressed together, the 2D material 804 disposed on the source substrate 802 is placed in contact with an opposing surface of the target substrate 806. When the 2D material 804 and the target substrate 806 are pressed together with a sufficient mechanical force, surface deformities or asperities may form in the 2D material 804 and/or the target substrate 806, causing the opposing surfaces to interlock or otherwise engage. Mechanical adhesion is produced by such surface contact between the 2D material 804 and the target substrate 806.

As discussed above with respect to FIGS. 1A and 5A-5D, in some embodiments, the heating element 830 can be configured and/or controlled to heat the target substrate 806 to a temperature t that softens the contact surface of the substrate. By softening the surface of the target substrate 806, the degree of mechanical contact between the 2D material 804 and the target substrate 806 (e.g., increased contact ratio) can increase, and thereby improve the strength of the mechanical adhesion between the opposing contact surfaces. As shown in the illustrated embodiment, the heating element 830 can be an electric heater or thermistor that can be disposed on the force applicator plate 820 to heat the target substrate 806 as it is passed between the force applicator roller 810 and the plate. In some embodiments, the heating element 840 can be controlled by a temperature controller 856.

In order to augment the mechanical adhesion between the 2D material layer 804 and the target substrate 806 to exceed the mechanical adhesion between the 2D material layer 804 and the target substrate 806, the high voltage power supply 840 can be configured and/or controlled to apply an electric field which induces an electrostatic force to attract the 2D material layer 804 towards the target substrate 806. As shown, the power supply 804 can generate the electric field by applying a voltage potential across a pair of conductive plates or films 812, 822 that are disposed between the force applicators 810, 820.

While the electromechanical adhesion applied between the 2D material layer 804 and the target substrate 806 exceeds the mechanical adhesion between the 2D material layer 804 and the source substrate 804, the source substrate can be readily separated from the 2D material layer 804 and the target substrate 806 can exit the printing device 800 with the 2D material layer 804 disposed thereon. In some embodiments, the source substrate 802 can be recycled and/or reused. After the source substrate 802 is removed from the 2D material layer 804 and the target substrate 806 exits the electric field, the 2D material layer 804 remains disposed on the target substrate 806 by mechanical adhesion by contact.

In some embodiments, the force applicator roller 810 can include two or more rollers coupled together by a conveyor belt and configured to operate in a manner similar to the rollers and conveyor belt 762a of FIG. 7B. For example, the conveyor belt can be conductive and/or otherwise configured to maintain the voltage potential applied by the high voltage power supply 840 with respect to the plate 820. By applying the voltage potential between a conveyor belt and the plate 820, the electric field induced by the high voltage power supply 840 can be maintained across the source and target substrates 802 and 806 to provide the electrostatic attraction forces that further enhance the adhesion between the target substrate 806 and the 2D material layer 804 along a path between the two or more rollers of the printing device 800, e.g., towards a pair of output rollers (not shown).

The various illustrative logical blocks, modules, circuits, and algorithm operations described in connection with the embodiments disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the claims.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver smart objects, e.g., a combination of a DSP and a microprocessor, two or more microprocessors, one or more microprocessors in conjunction with a DSP core, or any other such configuration. Alternatively, some operations or methods may be performed by circuitry that is specific to a given function.

In one or more aspects, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in a processor-executable software module or processor-executable instructions, which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage smart objects, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed embodiments is provided to enable any person skilled in the art to make or use the claims. Various modifications to these embodiments will be readily apparent to those skilled in the art, and the generic principles defined herein may be applied to other embodiments without departing from the scope of the claims. Thus, the present disclosure is not intended to be limited to the embodiments shown herein but is to be accorded the widest scope consistent with the following claims and the principles and novel features disclosed herein.

The invention claimed is:

1. A device for printing, comprising:
a first force applicator configured to receive a first substrate having a two-dimensional (2D) material disposed thereon and a second force applicator configured to receive a second substrate, the second force applicator being opposed to the first force applicator such that a first substrate having a 2D material disposed thereon received by the first force applicator and a second substrate received by the second force applicator are disposed between the first and second force applicators;
a force controller configured to control one or both of the first force applicator and the second force applicator to apply a mechanical force or a mechanical pressure that presses at least one of the first substrate and the second substrate towards the other to place the 2D material disposed on the first substrate in contact with a surface of the second substrate;
a power supply coupled to a first conductive element and a second conductive element that opposes the first conductive element;
a power supply controller configured to control the power supply to generate a voltage potential between the first and second conductive elements to apply an electric field across at least one of the first substrate and the second substrate to attract at least one of the 2D material and the first substrate towards the surface of the second substrate; and
a separator configured to separate the first substrate from the 2D material in contact with the surface of the second substrate;
wherein the force controller and the power supply controller are configured to control the applied mechanical force or mechanical pressure and voltage potential, respectively, to facilitate a direct transfer of the 2D material from a surface of the first substrate to the surface of the second substrate as the first and second substrates pass between the first and second force applicators.

2. The device of claim 1, wherein the first and second force applicators comprise one of (i) a first roller and a second roller, (ii) a roller and a plate, (iii) a first plate and a second plate, (iv) a first set of rollers with a first conveyor belt and a second set of rollers with a second conveyor belt, and (v) a first set of rollers with a conveyor belt and a plate.

3. The device of claim 1, wherein:
the first conductive element is one of the first force applicator, a conductive plate or film included in the first force applicator, and the first substrate, and
the second conductive element is one of the second force applicator, a second conductive plate or film included in the second force applicator, and a separate metallic foil received by the second force applicator concurrently with the second substrate.

4. The device of claim 1, further comprising a pre-oxidation chamber configured to oxidize a surface of a first substrate received by the first force applicator to weaken an attraction force between the 2D material associated with the first substrate and the surface of the first substrate.

5. The device of claim 1, further comprising:
a heating element configured to heat a second substrate received by the second force applicator to a temperature that is greater than a glassy transition temperature of the second substrate and less than a melting point of the second substrate.

6. The device of claim 1, wherein the force controller and the power supply controller are configured to control the applied mechanical force or mechanical pressure and voltage potential, respectively, to create an electromechanical adhesion between the 2D material and the surface of the second substrate that exceeds the mechanical adhesion between the 2D material and the surface of the first substrate as the first and second substrates pass between the first and second force applicators.

7. A device for printing, comprising:
a first force applicator configured to receive a first substrate having a two-dimensional (2D) material disposed thereon and a second force applicator configured to receive a second substrate, the second force applicator being opposed to the first force applicator such that a first substrate having a 2D material disposed thereon received by the first force applicator and a second substrate received by the second force applicator are disposed between the first and second force applicators; and
one or more controllers configured to control the first and second force applicators to apply a mechanical force or a mechanical pressure to at least one of the first and second substrates and an electrostatic force between the first and second substrates to facilitate a direct transfer of the 2D material from a surface of the first substrate to a surface of the second substrate without etching and without use of an adhesive as the first and second substrates pass between the first and second force applicators.

8. The device of claim 7, further comprising a power supply, and wherein the one or more controllers are configured to control the power supply to apply an electric field across at least one of the first substrate and the second substrate to produce the electrostatic force.

9. The device of claim 7, wherein the one or more controllers is configured to control the first force applicator and the second force applicator to apply a mechanical force or a mechanical pressure that presses at least one of the first substrate and the second substrate towards the other to place the 2D material disposed on the first substrate in contact with a surface of the second substrate.

10. The device of claim 7, further comprising a heating element, wherein the one or more controllers are configured to control the heating element to heat the second substrate received by the second force applicator to a temperature corresponding to a rubbery state of the second substrate.

11. The device of claim 7, wherein the one or more controllers are configured to control the applied mechanical force or mechanical pressure and voltage potential, respectively, to create an electromechanical adhesion between the 2D material and the surface of the second substrate that exceeds the mechanical adhesion between the 2D material and the surface of the first substrate as the first and second substrates pass between the first and second force applicators.

* * * * *